US008982566B2

(12) United States Patent
Huang et al.

(10) Patent No.: US 8,982,566 B2
(45) Date of Patent: Mar. 17, 2015

(54) MEMORY MODULE AND ELECTRICAL CONNECTOR FOR THE SAME

(75) Inventors: Hsin Mao Huang, Puxin Township, Changhua County (TW); Chun Huang Yu, Dacheng Township, Changhua County (TW); Chih Yen Ho, Luzhu Township, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 325 days.

(21) Appl. No.: 13/473,060

(22) Filed: May 16, 2012

(65) Prior Publication Data

US 2013/0308280 A1    Nov. 21, 2013

(51) Int. Cl.
*H05K 7/00*    (2006.01)
(52) U.S. Cl.
USPC ............................................ 361/729; 361/748
(58) Field of Classification Search
USPC ........................... 361/720, 728–729, 748, 760
See application file for complete search history.

(56) References Cited

U.S. PATENT DOCUMENTS

| | | | | |
|---|---|---|---|---|
| 5,833,478 A | * | 11/1998 | Tseng et al. | ................... 439/326 |
| 6,024,592 A | * | 2/2000 | Pai et al. | ........................ 439/326 |
| 6,115,243 A | * | 9/2000 | Horii | ........................ 361/679.09 |
| 6,157,538 A | * | 12/2000 | Ali et al. | ........................ 361/704 |
| 6,728,105 B2 | * | 4/2004 | Tanaka | ........................... 361/704 |
| 6,736,660 B2 | * | 5/2004 | Ku | .................................. 439/328 |
| 7,102,221 B2 | * | 9/2006 | Miyamoto et al. | ............ 257/690 |
| 7,414,312 B2 | | 8/2008 | Nguyen | |
| 7,459,784 B2 | * | 12/2008 | Wehrly et al. | .................. 257/707 |
| 7,701,724 B2 | * | 4/2010 | Tanaka et al. | .................. 361/752 |
| 8,189,342 B2 | * | 5/2012 | Bang et al. | ..................... 361/785 |
| 2002/0089831 A1 | | 7/2002 | Forthun | |

OTHER PUBLICATIONS

Cisco Memory Upgrade, "Memory Installation Guide for Cisco®—Cisco® Catalyst 5000 Supervisor Engine 1," website:http://ciscomemoryupgrade.com/Cisco_catalyst_5000_supervisor_engine1.html, retrieved date: May 15, 2012.

\* cited by examiner

*Primary Examiner* — Hung S Bui
(74) *Attorney, Agent, or Firm* — Ming Chow; Sinorica, LLC

(57) ABSTRACT

A memory module pair includes first and second memory modules. Each of the first and second memory modules includes a circuit board having opposite first and second side edges and a front edge, along which a plurality of pins are arranged. Each circuit board of the first and second memory modules has a key notch formed closer to the first side edge than to the second side edge. The circuit board of the first memory module has a corner notch that is formed on the front edge and the first side edge, while the circuit board of the second memory module has a corner notch that is formed on the front edge and the second side edge.

8 Claims, 8 Drawing Sheets

MEMORY MODULE AND ELECTRICAL CONNECTOR FOR THE SAME

1. TECHNICAL FIELD

The present invention relates to a memory module and an electrical connector.

2. BACKGROUND

A SODIMM, or small outline dual in-line memory module, is a type of computer memory. SODIMMs are normally used in systems that have space restrictions such as notebooks, small footprint personal computers, and networking devices such as routers. Generally, those systems are equipped with sockets configured to receive SODIMMs horizontally or vertically.

A SODIMM may comprise a circuit board, memory chips and electronic components such as capacitors, resistors, register chips, EEPROM (Electronically Erasable Programmable Read-Only Memory) chips containing SPD (Serial Presence Detect) data, and PLL (Phase-Locked Loop) chips. The memory chips and the electronic components may be disposed on the two opposite main surface of the circuit board. Therefore, when the SODIMM is horizontally installed, a space is required to accommodate the memory chips and the electronic components disposed beneath the circuit board, and such space is unacceptable for a thin system.

SUMMARY

One embodiment of the present invention proposes a memory module pair that comprises a first memory module and a second memory module. The first memory module comprises a first circuit board and a plurality of first pins. The first circuit board comprises a first side edge, a second side edge opposite the first side edge, and a front edge transverse to the first side edge. A first key notch is formed on the front edge of the first circuit board. The first key notch is closer to the first side edge of the first circuit board than to the second side edge of the first circuit board. A corner notch is formed on the first side edge and the front edge of the first circuit board. The plurality of first pins are arranged along the front edge of the first circuit board. The second memory module comprises a second circuit board and a plurality of second pins. The second circuit board comprises a first side edge, a second side edge opposite the first side edge, and a front edge transverse to the first side edge. A second key notch is formed on the front edge of the second circuit board. The second key notch is closer to the first side edge of the second circuit board than to the second side edge of the second circuit board. A corner notch is formed on the second side edge and the front edge portion of the second circuit board. The plurality of second pins are arranged along the front edge of the second circuit board.

One embodiment proposes a memory module that comprises a circuit board and a plurality of pins. The circuit board comprises two opposite side edges and a front edge extending transverse to the side edges. Two first side notches, configured for latching, are respectively formed on the two opposite side edges. A second side notch is formed on one of the side edges. The plurality of pins are arranged along the front edge portion.

One embodiment proposes an electrical connector. The electrical connector is configured to receive a memory module comprising a circuit board comprising two opposite side edges and a front edge extending transverse to the side edges. On the circuit board, two first side notches that are configured for latching are respectively formed on the two opposite side edges. A second side notch is formed on one of the side edges. The electrical connector comprises an insulating body, a protrusion and two latch arms. The insulating body comprises a slot for receiving the front edge. The protrusion protrudes from the insulating body and is configured to mate with the second side notch. The two latch arms extend from the insulating body. Each latch arm comprises a latch element configured to enter into a corresponding one of the first side notches for latching.

One embodiment proposes a memory module that comprises a circuit board and a plurality of pins. The circuit board comprises two opposite side edges and a front edge extending transverse to the side edges. Two first side notches that are configured for latching are respectively formed on the two opposite side edges. At least one second side notch is formed on one of the side edges. Two corner notches are formed on the circuit board, and each corner notch is formed on the front edge and a respective one of the side edges. The plurality of pins are arranged along the front edge portion.

Another embodiment proposes a memory module comprising a circuit board and a plurality of pins. The circuit board comprises two opposite side edges and a front edge. The front edge extends transverse to the side edges. A corner notch is formed on the front edge and a respective side edge, and the two corner notches are different.

Another embodiment discloses an electrical connector configured to receive a memory module comprising a circuit board and a plurality of pins, the circuit board comprising two opposite side edges, a front edge extending transverse to the side edges, and two different corner notches each formed on the front edge and a respective one of the side edges, and the plurality of pins arranged along the front edge. The electrical connector comprises an insulating body comprising a slot for receiving the front edge and two protrusions protruding from the insulating body and configured to mate with the corner notches.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION

Figures 1, 2:
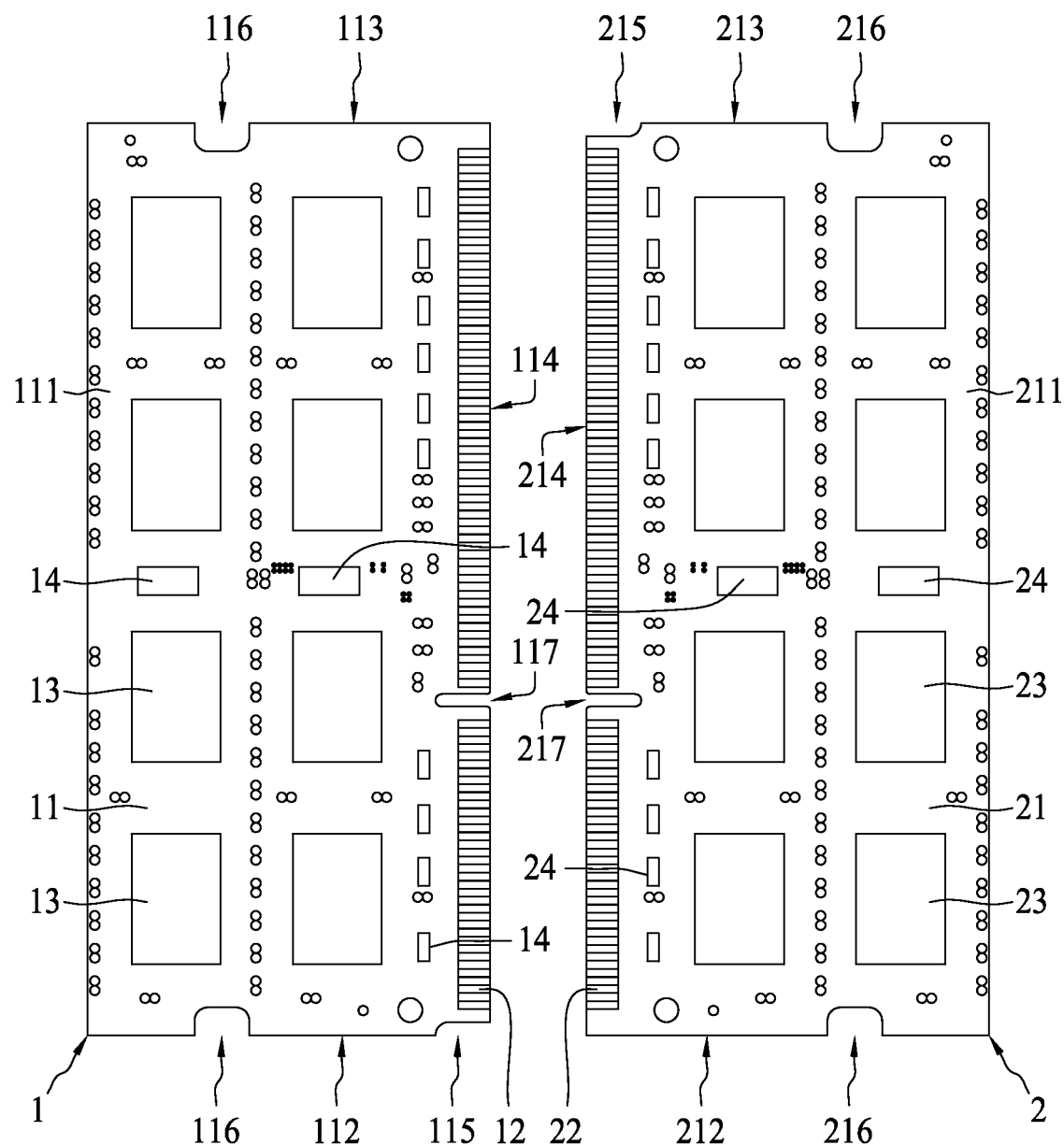
FIG. 1 is an illustration depicting a memory module according to one embodiment of the present invention.
FIG. 2 is an illustration depicting a memory module of a second type according to one embodiment of the present invention.

FIG. 1 is an illustration depicting a memory module 1 according to one embodiment of the present invention. Referring to FIG. 1, the memory module 1 comprises a circuit board 11, a plurality of pins 12, a plurality of memory chips 13, and a plurality of electronic components 14. The circuit board 11 comprises a side surface 111, a side edge 112, another side edge 113 opposite the side edge 112, and a front edge 114 extending transverse to the side edge 112 or 113. The plurality of pins 12 are arranged on the side surface 111 and along the front edge 114.

In one embodiment, the memory module 1 can be, but is not limited to, a SODIMM.

Normally, the electronic components 14 comprise capacitors, resistors, register chips, an EEPROM (Electronically Erasable Programmable Read-Only Memory) chip containing SPD (Serial Presence Detect) data, and PLL (Phase-Locked Loop) chips.

In one embodiment, all electronic components 14 and memory chips 13 of the memory module 1 are disposed on the side surface 111 of the circuit board 11. In other words, none of electronic components and memory chips of the memory module is disposed on any side surface of the circuit board 11 besides the side surface 111.

Figure 3:
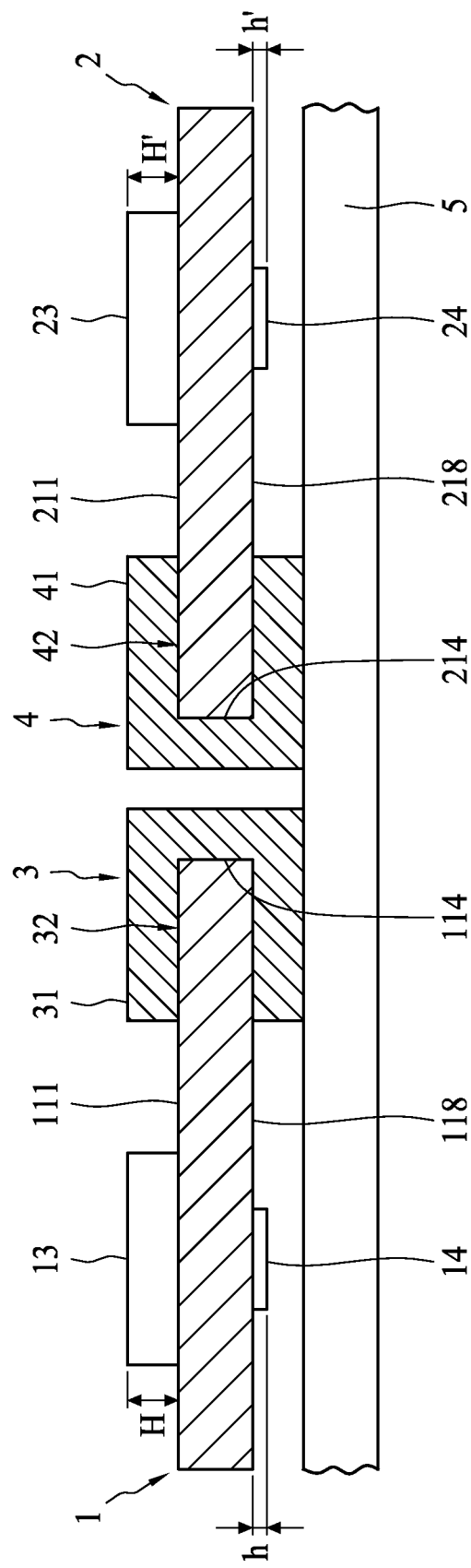
FIG. 3 is a cross-sectional view showing two memory modules respectively inserted into two electrical connectors according to one embodiment of the present invention.

Referring to FIGS. 1 and 3, in one embodiment, all memory chips 13 are disposed on the side surface 111 of the circuit board 11, and the electronic components 14 that have heights, h, less than heights, H, of the memory chips 13 are disposed on a side surface 118 opposite the side surface 111. As a result, the space below the circuit board 11, required for accommodating the underneath electronic components 14, can be reduced. As mentioned above, when no electronic component 14 or memory chip 13 is on the side surface 118, the height where an inserted memory module 1 is placed can be further reduced.

As shown in FIG. 1, a corner notch 115 is formed on the side edge 112 and the front edge 114. Moreover, two side notches 116 are respectively formed on the two side edges 112 and 113. The two side notches 116 are used to latch the memory module 1 after the memory module 1 is installed in an electrical connector. In addition, a key notch 117 is formed on the front edge 114. The key notch 117 is closer to the side edge 112 than to the side edge 113.

FIG. 2 is an illustration depicting a memory module 2 of a second type according to one embodiment of the present invention. Referring to FIG. 2, the memory module 2 comprises a circuit board 21, a plurality of pins 22, a plurality of memory chips 23, and a plurality of electronic components 24. The circuit board 21 comprises a side surface 211, a side edge 212, another side edge 213 opposite the side edge 212, and a front edge 214 extending transverse to the side edge 212 or 213. The plurality of pins 22 are arranged on the side surface 211 and along the front edge 214.

In one embodiment, the memory module 2 can be, but is not limited to, a SODIMM.

Similarly, the electronic components 24 comprise capacitors, resistors, register chips, an EEPROM (Electronically Erasable Programmable Read-Only Memory) chip containing SPD (Serial Presence Detect) data, and PLL (Phase-Locked Loop) chips.

In one embodiment, all electronic components 24 and memory chips 23 are disposed on the side surface 211 of the circuit board 21. Namely, no electronic component or memory chip is disposed on any other side surface of the circuit board 21.

As shown in FIGS. 2 and 3, in one embodiment, all memory chips 23 are disposed on the side surface 211, and the electronic components 24 that have heights, h', less than heights, H', of the memory chips 23 are disposed on the side surface 218 opposite the side surface 211. As a result, the space below the circuit board 21, required for accommodating the underneath electronic components 24, can be reduced. As mentioned above, when no electronic component 24 or memory chip 23 is disposed on the side surface 218, the height where an inserted memory module 2 is placed can be further reduced.

As shown in FIG. 2, a corner notch 215 is formed on the side edge 213 and the front edge 214. Moreover, two side notches 216 are respectively formed in the two side edges 212 and 213. The two side notches 216 are used to latch the memory module 2 after the memory module 2 is installed in an electrical connector. In addition, a key notch 217 is formed in the front edge 214. The key notch 217 is closer to the side edge 212 than to the side edge 213.

The memory module 1 and the memory module 2 are different types. As can be seen in FIGS. 1 and 2, in the memory module 1, when the side surface 111 that at least supports memory chips 13 faces upward, the side edge 112 closer to the notch 117, the front edge 114 and the side edge 113 are arranged sequentially in a counterclockwise direction. In comparison, in the memory module 2, when the side surface 211 that at least supports memory chips 23 faces upward, the side edge 212 closer to the notch 217, the front edge 214, and the side edge 213 are arranged sequentially in a clockwise direction.

Referring to FIGS. 1 through 4, the memory module 1 and the memory module 2 can be used together as a memory module pair 10 that can be applied for two back-to-back electrical connectors 3 and 4 on a printed circuit board 5. The electrical connector 3 is configured to receive only the type of memory module 1, and the electrical connector 4 is configured to receive only the type of the memory module 2. Each electrical connector 3 or 4 comprises an insulating body 31 or 41 formed with a slot 32 or 42 for receiving the front edge 114 or 214 of the memory module 1 or 2. The insulating body 31 or 41 is configured to retain a plurality of terminals that are used to establish electrical connections between the pins 12 or 22 of the memory module 1 or 2 and the printed circuit board 5. Each electrical connector 3 or 4 further comprises a protrusion 33 or 43 corresponding to, and formed to be mated with, the corner notch 115 or 215 and protruding from the insulating body 31 or 41. The protrusion 33 or 43 can ensure that the electrical connector 3 or 4 receives a correct memory module such that there is no chance a memory module is inserted with memory chips being below the circuit board, causing the memory chips to destructively impact the components on the printed circuit board 5 or the printed circuit board 5 itself. In one embodiment, the protrusion 33 or 43 is in the slot 32 or 42 of the electrical connector 3 or 4.

Figure 4:
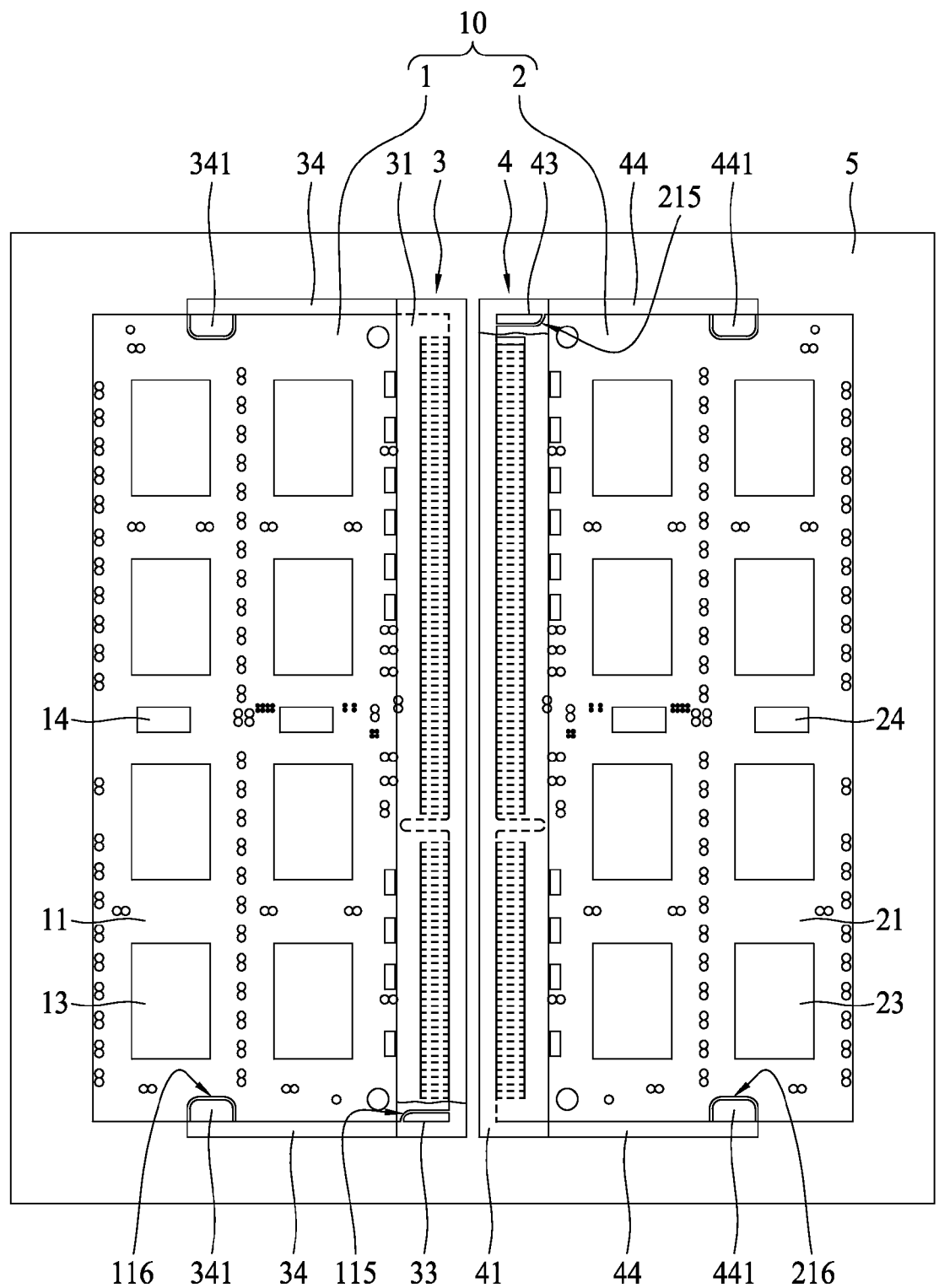
FIG. 4 is a top view showing two memory modules respectively inserted into two electrical connectors according to one embodiment of the present invention.

As illustrated in FIG. 4, each electrical connector 3 or 4 may comprise a latch arm 34 or 44 extending from the insulating body 31 or 41 and having a latch element 341 or 441 entering into the corresponding side notch 116 or 216 so that the memory module 1 or 2 can be secured in the electrical connector 3 or 4. Moreover, each insulating body 31 or 41 is formed with a polarization key that is in the corresponding slot 32 or 42. The polarization key is aligned with the corresponding key notch 117 or 217 if a memory module is installed correctly.

Figure 5:
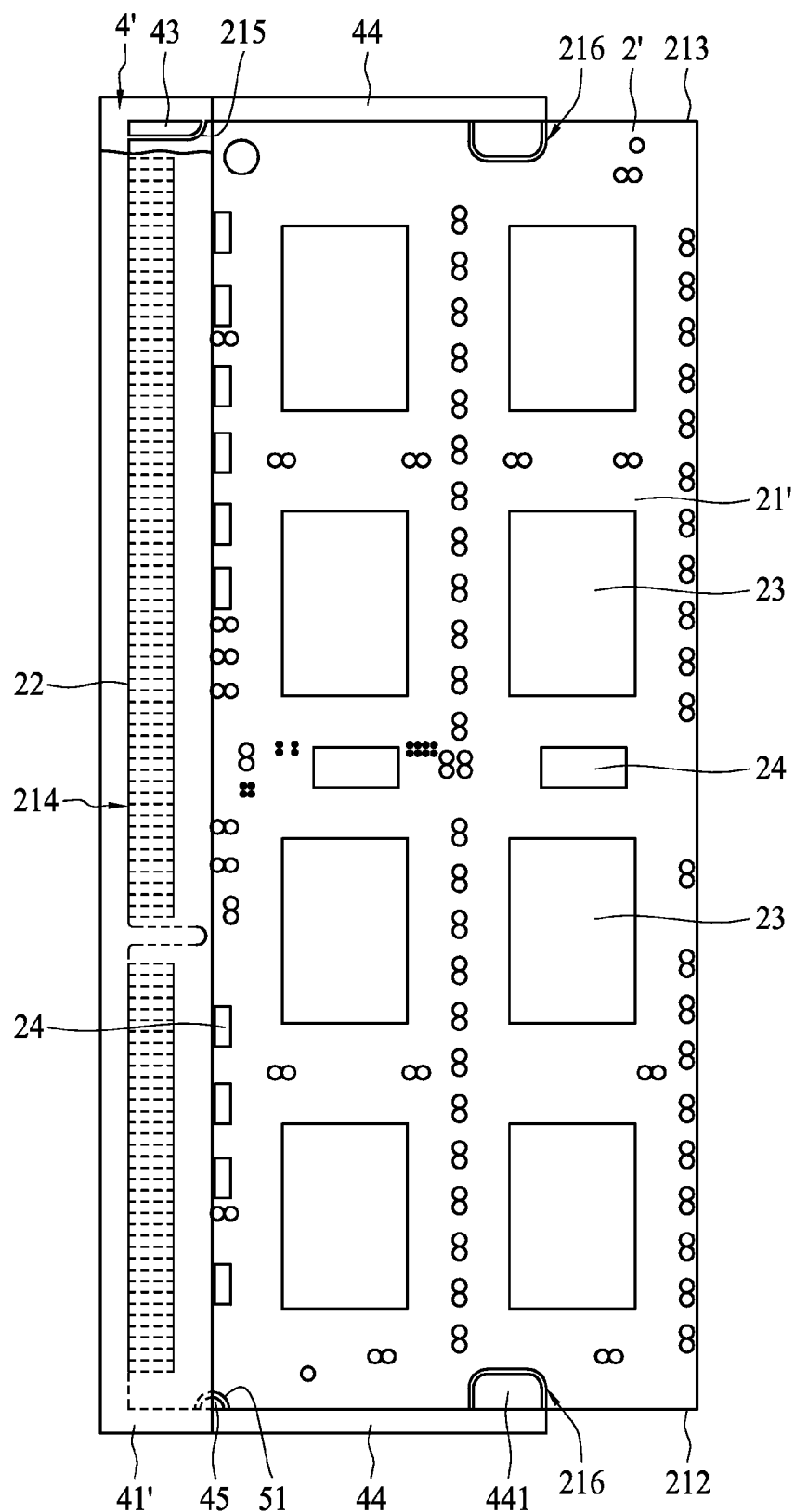
FIG. 5 is a top view showing a memory module inserted into an electrical connector according to one embodiment of the present invention.

FIG. 5 schematically demonstrates an electrical connector 4' and a memory module 2' according to another embodiment of the present invention. The memory module 1 and the memory module 2 may further comprise a side notch to ensure that the memory module 1 and the memory module 2 are inserted in correct orientations. Although the embodiment of FIG. 5 includes modifications of the memory module 2 and the connector 4 for demonstration, equivalent modifications can be applied to the memory module 1 and the connector 3.

As shown in FIG. 5, the circuit board 21' is further formed with a side notch 51. In the present embodiment, the side notch 51 is formed on the side edge 212. In another embodiment, the side notch 51 is formed on the side edge 213. Correspondingly, the electrical connector 4' may comprise another protrusion 45 extending from the insulating body 41'. The protrusion 45 is configured to mate with the side notch 51 such that the memory module 2' is always inserted in the electrical connector 4' with the memory chips 23 being on top of the circuit board 21'. In one embodiment, the protrusion 45 may be formed in the slot 42 of the insulating body 41'. In one embodiment, the protrusion 45 may be formed outside the slot 42 of the insulating body 41'. In one embodiment, a memory module may include such side notch 51, but not include a corner notch, while the insulating body of a corresponding electrical connector is formed to have a protrusion for engaging the side notch, but have no protrusion for a corner notch.

As can be seen in FIG. 5, a corner notch 215 is formed on the side edge 213 and the front edge 214, and the electrical connector 4' further comprises a protrusion 43 corresponding to and formed to be mated with the corner notch 215 and protruding from the insulating body 41'. The protrusion 43 can further ensure that the electrical connector 4' receives a correct memory module such that there is no chance a memory module is inserted with memory chips being below the circuit board, causing the memory chips to destructively impact the components on the printed circuit board 5 or the printed circuit board 5 itself. In one embodiment, the protrusion 43 is in the slot of the electrical connector 4'.

Figure 6:
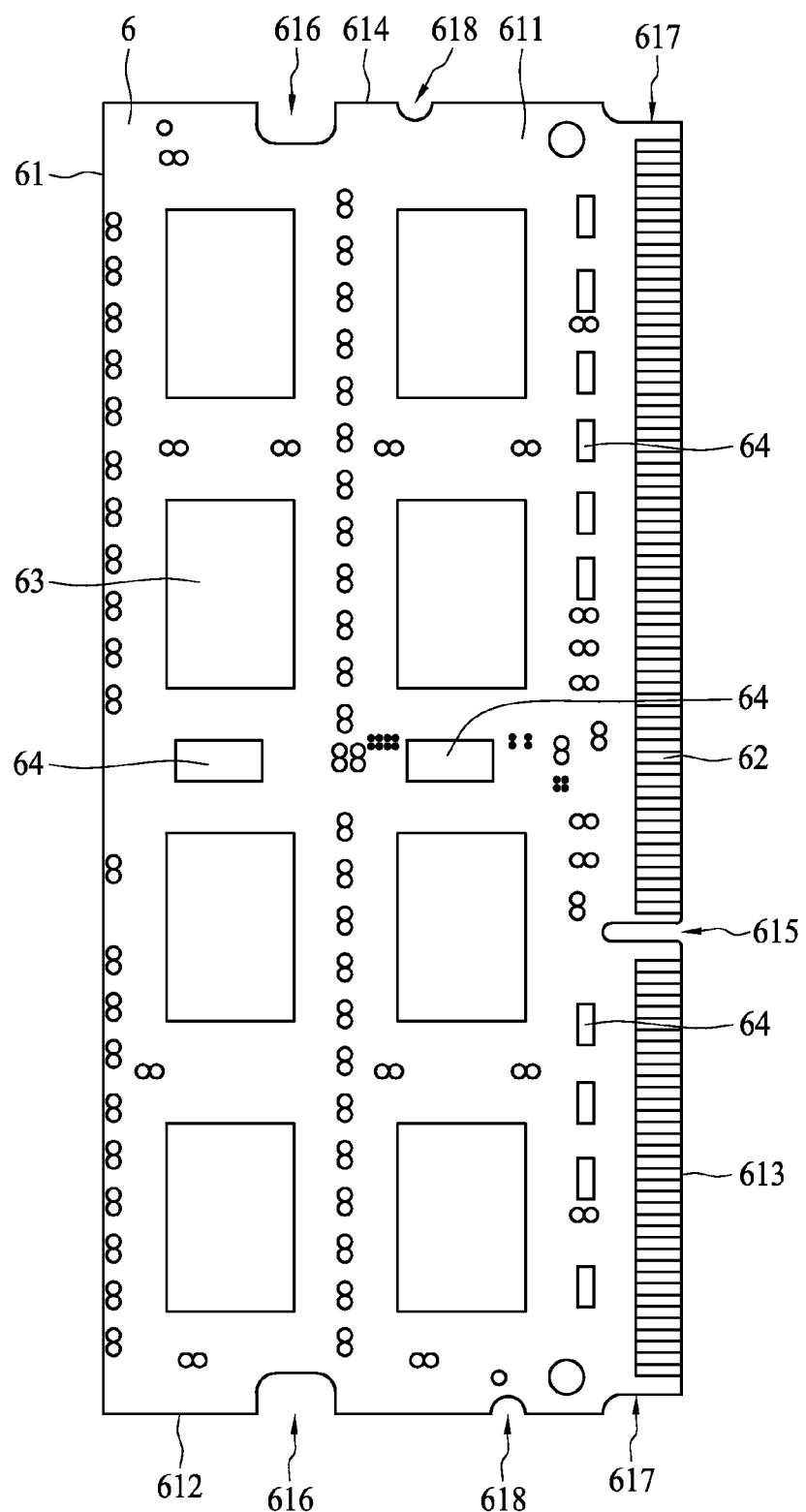
FIG. 6 is a view showing a memory module according to another embodiment of the present invention.

FIG. 6 schematically demonstrates a memory module 6 according to one embodiment of the present invention. As shown in FIG. 6, the memory module 6 comprises a circuit board 61, a plurality of pins 62, a plurality of memory chips 63, and a plurality of electronic components 64.

The circuit board 61 comprises a side surface 611, which is defined by a side edge 612, a front edge 613, and a side edge 614. The plurality of pins 62 are arranged along the front edge 613. The side surface 611 may support all the memory chips 63 and the electronic components 64, or support only all the memory chips 63, or support all the memory chips 63 and a portion of taller electronic components 64.

A key notch 615 is formed on the front edge 613. Two side notches 616 are respectively formed on the side edges 612 and 614 for latching the memory module 6. Two corner notches 617 can be formed, and each is on the front edge 613 and the corresponding side edge 612 or 614. With the two corner notches 617, the memory module 6 can be inserted into a shorter electrical connector that requires a smaller installation area. In some embodiments, the two corner notches 617 can have similar dimensions.

The circuit board 61 may further comprise at least one side notch 618. The side notch 618 can be formed in either the side edge 612 or the side edge 614 of the circuit board 61. The side notch 618 is used to ensure that the memory module 6 is inserted with the side surface 611 supporting memory chips 63 and/or taller electronic components 64 facing upward in order to prevent the situation in which memory chips 63 and/or taller electronic components 64 collide with a printed circuit board or components on a printed circuit board. In the present invention, two side notches 618 are respectively formed on the side edges 612 and 614. In one embodiment, the two side notches 618 are not aligned in a direction parallel to the front edge 613.

Figure 7:
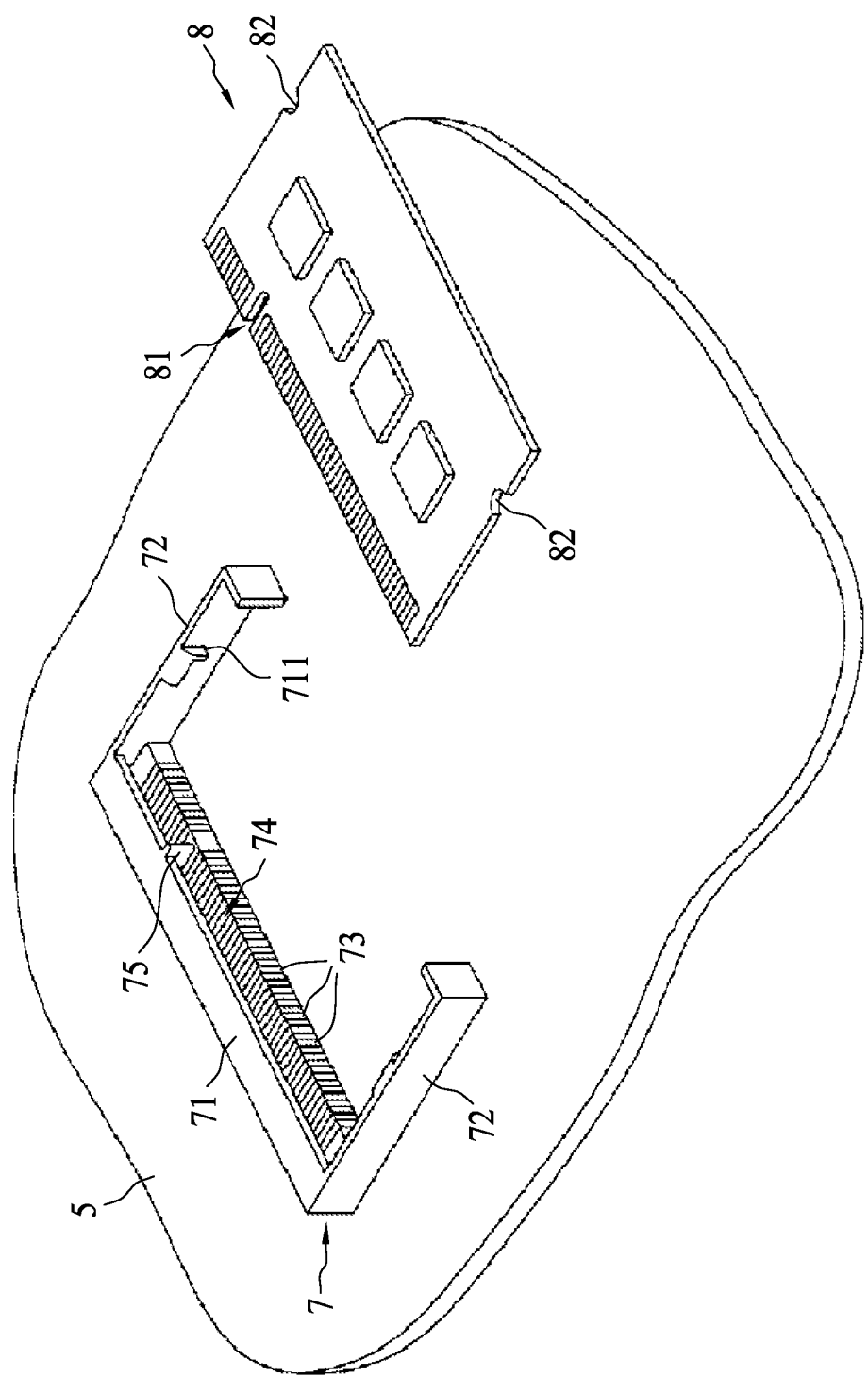
FIG. 7 is a perspective view showing an electrical connector according to one embodiment of the present invention.

As shown in FIG. 7, an electrical connector 7 applicable in the embodiments of the present invention comprises an insulating body 71, two latch arms 72 extending from the insulating body 71 and each having a latch element 711 for engaging side notch 82 of a memory module 8, a plurality of terminals 73 attached to the insulating body 71, a slot 74 extending in the insulating body 71 for receiving a memory module 8, and a polarization key 75 for engaging the key notch 81 of the memory module 8.

Figure 8:
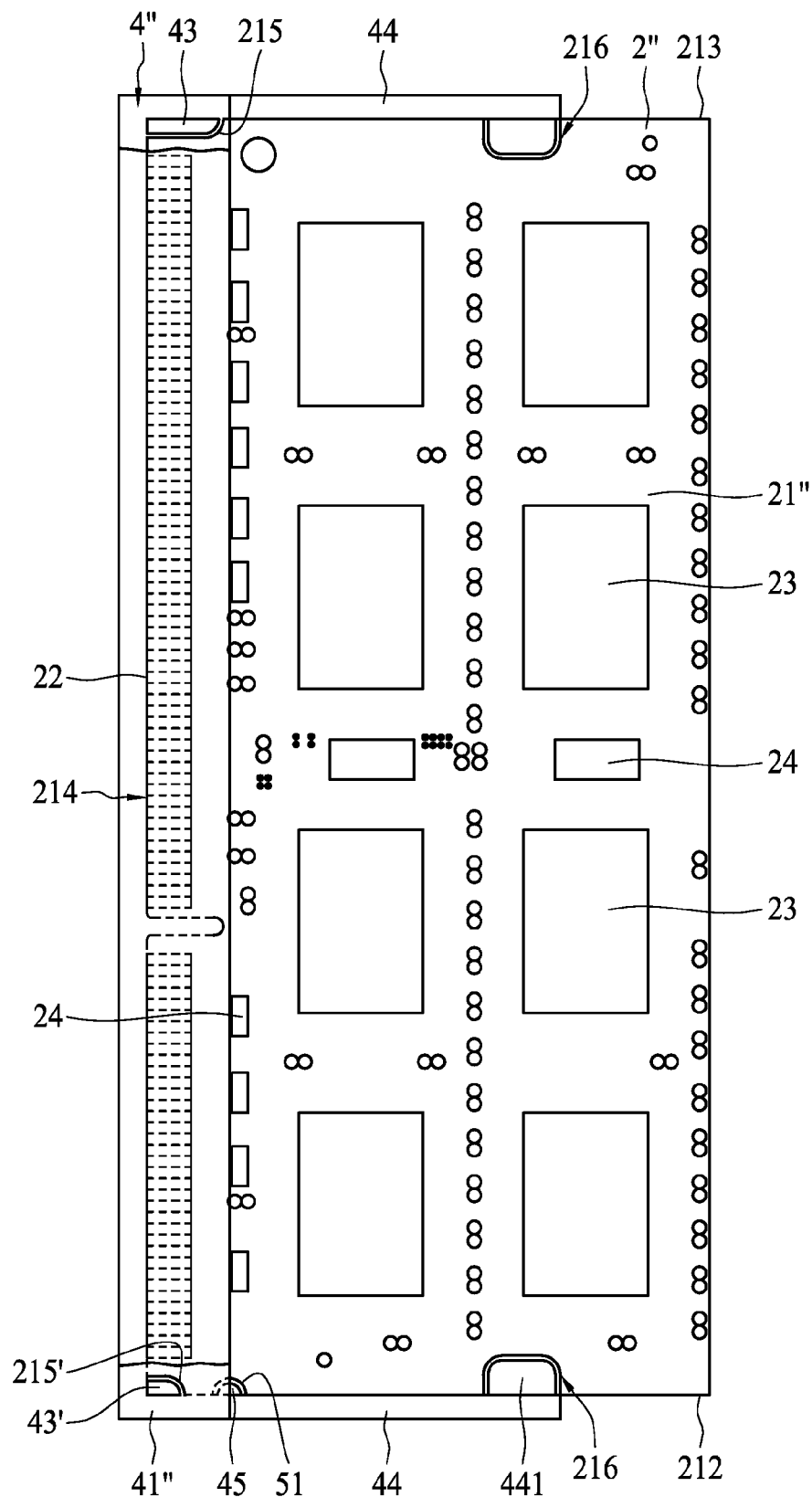
FIG. 8 is a top view showing a memory module inserted into an electrical connector according to another embodiment of the present invention.

FIG. 8 is a top view showing a memory module inserted into an electrical connector according to another embodiment of the present invention. Referring to FIG. 8, in some embodiments, a memory module 2" comprises a circuit board 21" including two corner notches 215 and 215' each formed on the front edge 214 and a corresponding side edge 212 or 213. The circuit board 21" carries memory chips 23, and the two corner notches 215 and 215' are different so as to ensure the memory chips 23 being on the top of the circuit board 21" after the installation of the memory module 2".

Correspondingly, the insulating body 41" of the electrical connector 4" can be formed with two protrusions 43 or 43' corresponding to the two corner notches 215 and 215' of the memory module 2". Each protrusion 43 or 43' is fit with the corresponding corner notch 215 or 215'. As such, the two protrusions 43 and 43' are different in size, and the memory module 2" can be properly inserted to the electrical connector 4" when the corner notches 215 and 215' meet their corresponding protrusions 43 and 43'; otherwise, the memory module 2" cannot be inserted to the electrical connector 4". In some embodiments, the protrusions 43 and 43' can be in the slot of the insulating body 41" that receives the front edge 214 of the circuit board 21". In some embodiments, the protrusions 43 and 43' can be in the slot, and the larger one of the protrusions 43 and 43' extend outside the slot.

In some embodiments, the two corner notches 215 and 215' can have different configurations or shapes, and the protrusions 43 and 43' are formed with mated configuration. As such, the insertion orientation of the memory module 2" can be fixed.

In some embodiments, the circuit board 21" is further formed with a side notch 51, which may be formed on the side edge 212. In another embodiment, the side notch 51 is formed on the side edge 213. Correspondingly, the insulating body 41" may be formed with another protrusion 45. The protrusion 45 is configured to mate with the side notch 51 such that the memory module 2" is always inserted in the electrical connector 4" with the memory chips 23 being on top of the circuit board 21". In one embodiment, the protrusion 45 may be formed in the slot of the insulating body 41". In one embodiment, the protrusion 45 may be formed outside the slot of the insulating body 41".

Figure 9:
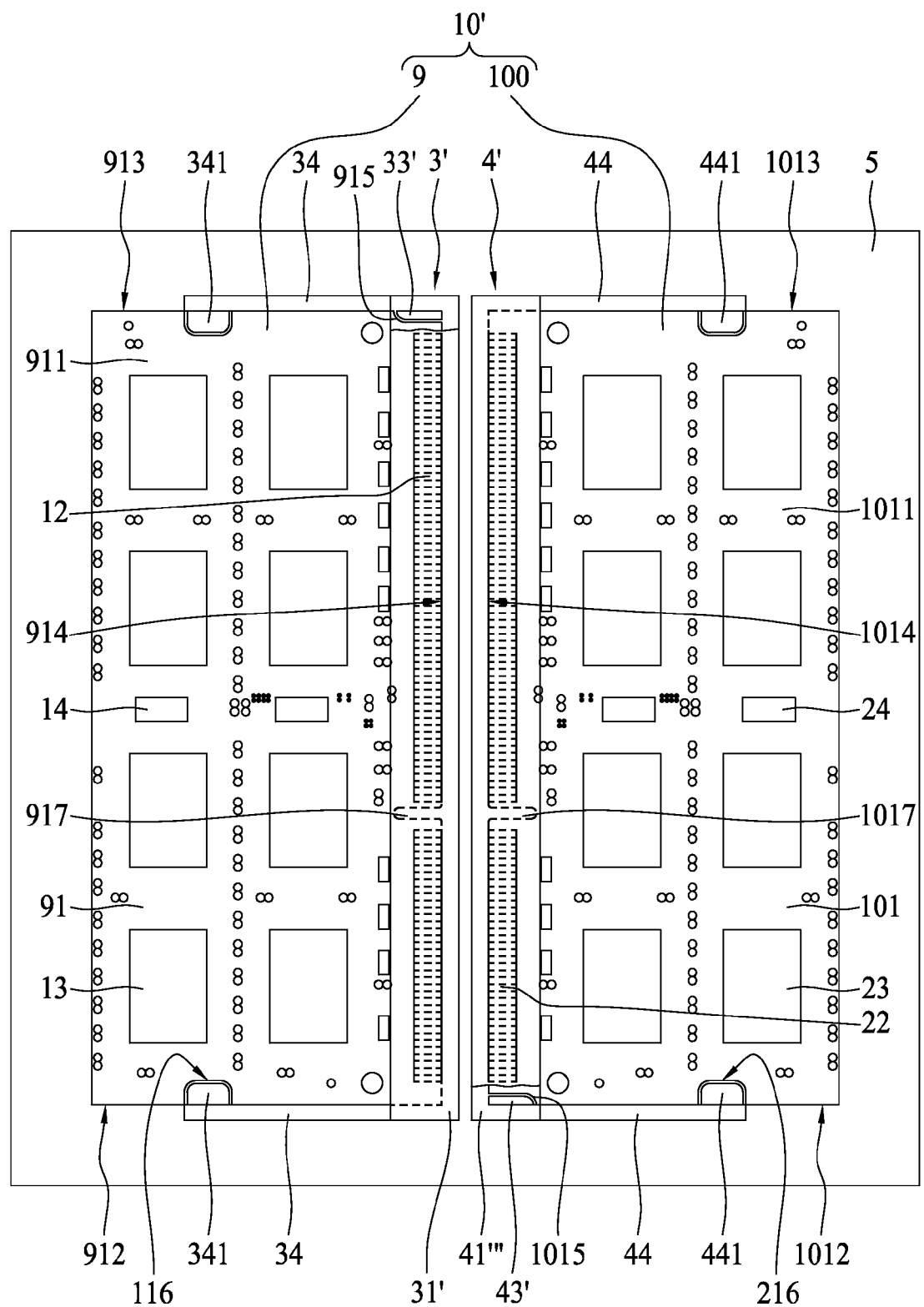
FIG. 9 is a top view showing two memory modules respectively inserted into two electrical connectors according to another embodiment of the present invention.

FIG. 9 is a top view showing two memory modules 9 and 100 included in a memory module pair 10' and respectively inserted into two electrical connectors 3' and 4' according to another embodiment of the present invention. As shown in FIG. 9, the memory module 9 comprises a circuit board 91 defined by a side edge 912, a front edge 914, another side edge 913, and a side surface 911 that at least supports memory chips 13. A plurality of pins 12 are arranged along the front edge 914. The side edge 912, the front edge 914 and the side edge 913 are arranged sequentially in a counterclockwise direction when the side surface 911 faces upward. The circuit board 91 is formed with two side notches 116, a key notch 917 and a corner notch 915. The key notch 917 is formed in the front edge 914, closer to the side edge 912 than to the side edge 913. The corner notch 915 is formed on the front edge 914 and the side edge 913. The two side notches 116 for engaging the latch elements 341 on the latch arms 34 are respectively formed on the side edges 912 and 913.

The front edge 914 is configured to be received in an electrical connector 3'. Correspondingly, a protrusion 33' is formed on the insulating body 31' of the electrical connector 3' and mated with the corner notch 915 of the circuit board 91 such that the side surface 911 can face upward after the memory module 9 is inserted.

Moreover, the memory module 9 can be paired with a memory module 100 to form a memory module pair 10'. Referring to FIG. 9, the memory module 100 comprises a circuit board 101 defined by a side edge 1012, a front edge 1014, another side edge 1013, and a side surface 1011 that at least supports memory chips 23. A plurality of pins 22 are arranged along the front edge 1014. The side edge 1012, the front edge 1014, and the side edge 1013 are arranged sequentially in a clockwise direction when the side surface 1011 faces upward. The circuit board 101 is formed with two side notches 216 for engaging the latch elements 441 on latch arms 44, a key notch 1017 formed on the front edge 1014 and being closer to the side edge 1012 than to the side edge 1013, and a corner notch 1015 formed on the front edge 1014 and the side edge 1012.

An electrical connector 4' receives the front edge 1014 of the circuit board 101 when the memory module 100 is inserted. Correspondingly, a protrusion 43' is formed on the insulating body 41''' and mated with the corner notch 1015 of the circuit board 101 such that the side surface 1011 can face upward after the memory module 100 is inserted.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. An electrical connector configured to receive a memory module comprising a circuit board, wherein the circuit board comprises two opposite side edges, a front edge extending transverse to the side edges, two first side notches configured for latching and respectively formed on the two opposite side edges, one second side notch formed on one of the side edges, and two corner notches each formed on the front edge and a respective one of the side edges; the electrical connector comprises a first protrusion configured to mate with the second side notch, two second protrusions configured to mate with the two corner notches, and the electrical connector comprises:

an insulating body comprising a slot for receiving the front edge;

a protrusion protruding from the insulating body and configured to mate with the second side notch; and two latch arms extending from the insulating body and each comprising a latch element configured to enter into a corresponding one of the first side notches for latching.

2. The electrical connector of claim 1, wherein the protrusion is in the slot.

3. The electrical connector of claim 1, wherein the protrusion is outside the slot.

4. A memory module comprising:

a circuit board comprising two opposite side edges, a front edge extending transverse to the side edges, two first side notches configured for latching and respectively formed on the two opposite side edges, at least one second side notch formed on one of the side edges, and two corner notches each formed on the front edge and a respective one of the side edges;

a plurality of pins arranged along the front edge portion;

the circuit board comprises two second side notches respectively disposed on the side edges and misaligned in a direction parallel to the front edge of the circuit board; and the two corner notches have different dimensions.

5. A memory module comprising:

a circuit board comprising two opposite side edges, a front edge extending transverse to the side edges, and two different corner notches each formed on the front edge and a respective one of the side edges;

a plurality of pins arranged along the front edge portion;

the circuit board comprises two first side notches configured for latching and respectively formed on the two opposite side edges and at least one second side notch formed on one of the side edges; and the corner notches are different in size or in configuration.

6. An electrical connector configured to receive a memory module comprising a circuit board and a plurality of pins, the circuit board comprising two opposite side edges, a front edge extending transverse to the side edges, and two different corner notches each formed on the front edge and a respective one of the side edges, and the plurality of pins arranged along the front edge, the electrical connector comprising:

an insulating body comprising a slot for receiving the front edge;

two protrusions protruding from the insulating body and configured to mate with the corner notches; and the corner notches are different in size or in configuration.

7. The electrical connector of claim 6, wherein the protrusions are in the slot.

8. The electrical connector of claim 6, wherein a larger one of the protrusions extends outside the slot.

* * * * *